United States Patent [19]
Scott et al.

[11] Patent Number: 5,298,810
[45] Date of Patent: Mar. 29, 1994

[54] BICMOS CMOS/ECL DATA MULTIPLEXER

[75] Inventors: Paul H. Scott, San Jose; Bertrand J. Williams, Campbell, both of Calif.

[73] Assignee: Cypress Semiconductor Corporation, San Jose, Calif.

[21] Appl. No.: 943,932

[22] Filed: Sep. 11, 1992

[51] Int. Cl.$^5$ .................. H03K 19/092; H03K 3/01
[52] U.S. Cl. ................... 307/475; 307/446; 307/296.1
[58] Field of Search ........... 307/475, 473, 446, 296.1, 307/243

[56] References Cited

U.S. PATENT DOCUMENTS

| | | | |
|---|---|---|---|
| 5,034,635 | 7/1991 | Ten Eyck | 307/475 |
| 5,089,789 | 2/1992 | Van Tran | 307/475 |
| 5,160,857 | 11/1992 | Barre | 307/446 |

Primary Examiner—Edward P. Westin
Assistant Examiner—Richard Roseen
Attorney, Agent, or Firm—Blakely, Sokoloff, Taylor & Zafman

[57] ABSTRACT

An ECL circuit with power control is disclosed. The ECL circuit comprises a pair of emitter-coupled transistors with a current source transistor having its collector coupled to the coupled-emitters of the pair. Coupled in series with the base of the current source transistor is a first MOS transistor with its gate receiving an enable signal to control the first MOS transistor. As such, an activated first MOS transistor switches on the ECL circuit, and a de-activated first MOS transistor switches off the ECL circuit with no current through the current source transistor to provide a true power down of the ECL circuit. An ECL circuit for translating from CMOS to ECL levels is also disclosed. The ECL circuit comprises a pair of emitter-coupled transistors and first MOS transistor coupled in series with a first base of the pair at one end of the source/drain current path of the first MOS transistor. Another end of the source/drain current path of the first MOS transistor is coupled to a current-source voltage, while its gate receives an enable signal. Coupled in series with a second base of the pair at one end of the source/drain current path of the second MOS transistor is a second MOS transistor. Another end of the source/drain current path of the second MOS transistor is also coupled to the current-source voltage, while its gate receives an inverted enable signal. Thus, the pair has its two emitter-coupled transistors alternately switched on by the enable and inverted enable signals. An ECL circuit for multiplexing ECL inputs with CMOS select signals is further disclosed. The ECL circuit comprises the top portion of a conventional ECL multiplexer connected to a pair of Vcs current sources. The current sources are alternately selected by the N-channel MOS transistor coupled between the Vcs current source and one base of the n-p-n transistors.

21 Claims, 3 Drawing Sheets

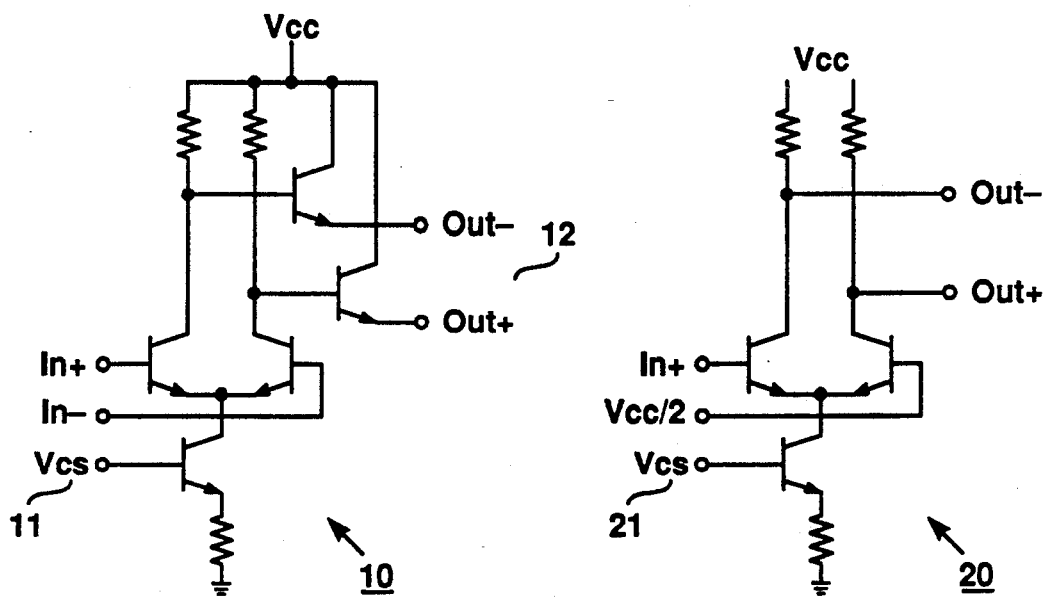
**Figure 1
(Prior Art)**
**Figure 2
(Prior Art)**
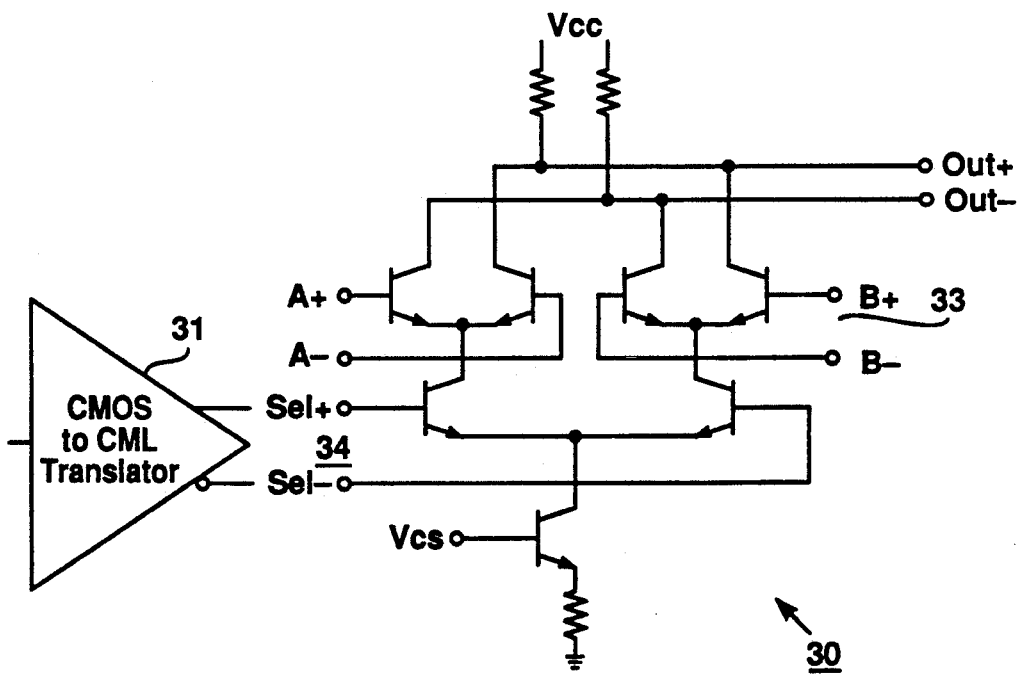
**Figure 3
(Prior Art)**

BICMOS CMOS/ECL DATA MULTIPLEXER

BACKGROUND OF THE INVENTION

1. Field of the Invention

The present invention relates to emitter-coupled logic ("ECL") circuits and more specifically to controlling the output signals of such ECL circuits using CMOS compatible signals.

2. Art Background

FIG. 1 illustrates a typical ECL output buffer 10 without a current source control. As shown in FIG. 1, ECL output buffers are not normally turned off because of the difficulty in controlling the current source 11 that supplies the gate while maintaining DC and AC performance of the gate. While it is possible to shunt the power away from the differential stage (with another switch at the second level, for instance) of the ECL output 12, current is still flowing and contributes to chip power dissipation.

The conventional ECL output buffers as shown in FIG. 1 have their drawbacks and disadvantages. Products with application optional ECL outputs are burdened by the extra power supply currents that serve the unused outputs. The current of any particular application is typically never less than that of the application that uses the full complement of outputs. This current is small, but not negligible (often 3–10 mA per output or 15–50 mW) and will cause the application to run hotter than actually required. Therefore, it becomes desirable to be able to control the current source in ECL circuits.

An ECL gate, such as the one shown in FIG. 1, is often used in connection with signals in the CMOS logic levels. Translations between the logic levels of CMOS logic and the logic levels of CML ("current mode logic") or ECL logic are typically done using a differential amplifier with a "mid-swing" reference. FIG. 2 illustrates a typical ECL (CML) translator 20. Translator 20 can be an efficient translator if a mid-swing reference 21 is available, but for logic levels with non standard swings, or for mixed power supply voltage systems, this reference is often less than ideal.

The conventional translators as shown in FIG. 2 have their drawbacks and disadvantages. The voltage defined a "mid-swing" must be developed with either resistive or matched transistor voltage dividers. These circuits take up significant area and power that is not required for the intrinsic logic function being performed. Errors in the levels set by the reference voltage generators also contribute to variations in the propagation delay of the gate. Further, the conventional methods of translating between CMOS and CML levels use referenced generators which require some additional circuitry and power dissipation that is not used by the intrinsic logic function. Therefore, it is also desirable to be able to translate CMOS signals to levels compatible with CML cells.

Furthermore, in high performance digital logic, the high speed signals are typically ECL or CML, which must be routed and logically manipulated in bipolar circuitry. The lower speed logic may be CMOS for a reduction in power. The interface between these logic levels also requires a translator to convert the large swing CMOS levels to the small ECL/CML logic levels used in the high speed gates.

The addition of a level translator requires an increase in both speed and power, over what is required for the intrinsic logic function. In the typical CML multiplexer circuit 30 shown in FIG. 3, the high speed data channels would be connected to inputs A+ and A−32 and B+ and B−33 as the select input 34 is driven by a CMOS/CML translator 31. The translator 31 adds delay and power to the circuit 30 and performs no logic function in this configuration. Thus, it is further desirable to be able to multiplex CML compatible data signals using CMOS compatible signals to switch between channels without the added delay and power.

As will be described in the following, the present invention will disclose an ECL circuit with a power supply current control to allow the output to shut off to reduce system power supply load. The following description will also disclose an ECL circuit capable of translating CMOS signals to levels compatible with CML cells. Further, the following description will disclose an ECL circuit capable of multiplexing CML compatible data signal levels while using CMOS compatible signals to switch between channels.

SUMMARY OF THE INVENTION

Therefore, it is an object of the present invention to provide an ECL output buffer with current shut-off control.

It is also an object of the present invention to provide an ECL circuit capable of translating CMOS signals to ECL compatible levels.

It is another object of the present invention to provide an ECL circuit capable of multiplexing ECL compatible data signals using CMOS signals to switch between channels without the added delay and power in the conventional system.

An ECL circuit with power control is disclosed. The ECL circuit comprises a pair of emitter-coupled transistors with a current source transistor having its collector coupled to the coupled-emitters of the pair. Coupled in series with the base of the current source transistor is a first MOS transistor with its gate receiving an enable signal to control the first MOS transistor. As such, an activated first MOS transistor switches on the ECL circuit, and a de-activated first MOS transistor switches off the ECL circuit with no current through the current source transistor to provide a true power down of the ECL circuit.

An ECL circuit for translating from CMOS to ECL levels is also disclosed. The ECL circuit comprises a pair of emitter-coupled transistors and first MOS transistor coupled in series with a first base of the pair at one end of the source/drain current path of the first MOS transistor. Another end of the source/drain current path of the first MOS transistor is coupled to a current-source voltage, while its gate receives an enable signal. Coupled in series with a second base of the pair at one end of the source/drain current path of the second MOS transistor is a second MOS transistor. Another end of the source/drain current path of the second MOS transistor is also coupled to the current-source voltage, while its gate receives an inverted enable signal. Thus, the pair has its two emitter-coupled transistors alternately switched on by the enable and inverted enable signals.

An ECL circuit for multiplexing ECL inputs with CMOS select signals is further disclosed. The ECL circuit comprises the top portion of a conventional ECL multiplexer connected to a pair of Vcs current sources. The current sources are alternately selected by the N-channel MOS transistor coupled between the Vcs current source and one base of the n-p-n transistors. Thus, voltage levels compatible with CMOS logic levels can select the ECL data inputs as output of the ECL circuit.

BRIEF DESCRIPTION OF THE DRAWINGS

The objects, features and advantages of the present invention will become apparent to one skilled in the art from reading the following detailed description in which:

FIG. 1 illustrates a typical ECL output buffer without current source control.

FIGS. 2 illustrates a typical ECL translator.

FIGS. 3 illustrates a typical ECL multiplexer circuit.

DETAILED DESCRIPTION OF THE INVENTION

In the following description, numerous specific details are set forth in order to provide a thorough understanding of the present invention. It will be obvious, however, to one skilled in the art that these details are not required to practice the present invention. In other instances, well-known circuits, methods and the like are not set forth in detail in order to avoid unnecessarily obscuring the present invention.

Figure 4:
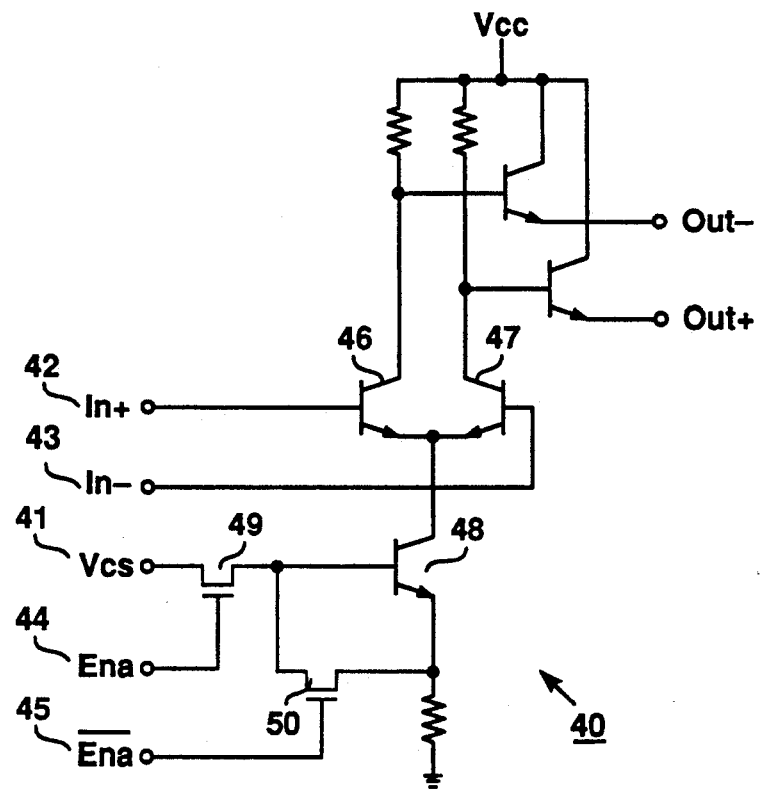
FIG. 4 illustrates an ECL gate of the present invention with power control implemented.

FIG. 4 illustrates an ECL gate 40 of the present invention with power control implemented. As shown in FIG. 4, an ECL differential pair of n-p-n transistors 46,47 have their bases coupled to two inputs In+ and In−42, 43. Current source transistor 48 has its collector coupled to the coupled-emitters of transistors 46,47. To facilitate current control, the source/drain current path of an N-channel MOS transistor 49 is coupled in series between voltage Vcs 41 and the base of current source transistor 48. Voltage Ena 44 is applied to the gate of N-channel transistor 49. The source/drain current path of a shunt N-channel MOS transistor 50 is connected across the base and emitter of current source transistor 48. Voltage Ena-BAR 45 is applied to the gate of the shunt N-channel MOS transistor 50. To control the switch current of the ECL output, it is only necessary to insure that "Ena" 44 is logically HIGH, and "Ena-BAR" 45 is LOW when the gate 40 is to be operational. The voltage drop across the N-channel transistor 49 in series with Vcs 41 has a negligble affect on the switch current.

When the ECL gate 40 is to be switched "OFF", the level on "Ena" 44 is logically LOW and "Ena-BAR" 45 is set HIGH. This causes current source of the ECL gate 40 to be quenched, thus turning the gate off. This "OFF" state effectively eliminates the ECL gate current, and can be achieved with normal CMOS switches and thus is achieved with no power penalty.

It will be apparent to those skilled in the art that it might be possible to remove the shunt N-channel MOS transistor 50, if "turn-on/turn-off speed" were not critical, or if it were possible to ensure that the NPN current source transistor 48 would not accidentally turn on and leak unpredictable amounts of current. As described, it should be appreciated by those skilled in the art that this circuit allows a true power down ECL output buffer to be provided in power critical applications.

Figure 5:
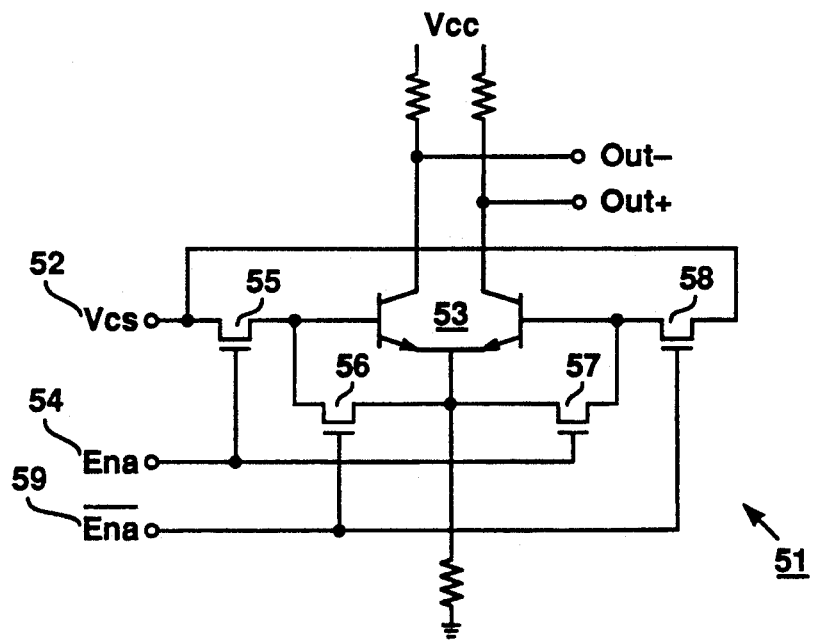
FIGS. 5 illustrates an ECL translator with current control mechanism implemented in another embodiment.

FIG. 5 illustrates an ECL translator 51 with the current control mechanism implemented in another embodiment. As described above, a typical translator circuit shown in FIG. 2 would need to include additional circuitry and require additional power to generate the "VCC/2" reference. As shown in FIG. 5, an ECL translator in this embodiment has no such circuitry.

Referring to FIG. 5, voltage Vcs 52 is coupled to both bases of the differential pair of transistors 53 through serially-connected N-channel MOS transistors 55,58. The source and drain current path of shunt N-channel MOS transistor 56 is connected across the coupled-emitters of differential pair 53 and one base of the differential pair 53. The source and drain current path of shunt N-channel MOS transistor 57 is similarly connected across the coupled-emitters of differential pair 53 and another base of the differential pair 53. Voltage Ena 54 is applied to the gates of transistors 55, 57, while Ena-BAR 59 is applied to the gates of transistors 56, 58. Complimentary outputs can be obtained at the collectors of the differential pair 53.

Ena 54 and Ena-BAR 59 could be built into the translator cell 51 by including a typical CMOS inverter in the schematic. This would make the buffer a single ended CMOS-to-differential CML translator.

Referring to FIG. 5, translator 51 according to the teaching of the present invention consists of a pair of Vcs current sources 52 that are alternatively selected by N-channel MOS transistors 55, 58 connected between the Vcs reference source and the bases of the NPN transistor pair 53. Voltage levels are compatible with normal CMOS logic levels and the delays are adequate for normal logic functions.

It will be apparent to those skilled in the art that it might be possible to remove the shunt N-channel MOS transistors 56, 57, if "turn-on/turn-off speed" were not critical, or an alternative connection may include a high value resistor connected in place of the shunt N-channel MOS transistors 56, 57.

Figure 6:
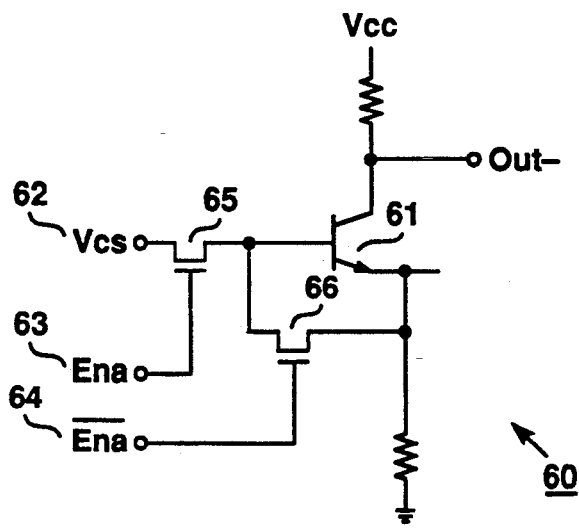
FIG. 6 illustrates an ECL translator in an embodiment with single-ended input.

The ECL translator 51 according to the present invention provides a convenient and efficient means for connecting CMOS with ECL or CML logic functions. The ECL translator 51 would not require any additional reference generator circuitry or additional power to perform its function. Referring to FIG. 6, if the logic function to be driven does not need both senses of the CMOS signal, the translator can be reduced to a single ended, inverting buffer. Note that voltage Vcs 62 is applied to only the base of NPN transistor 61 through in-series N-channel MOS transistor 65. A shunt N-channel MOS transistor 66 is connected across the base and emitter of NPN transistor 61. Signal Ena 63 is applied to the gate of in-series transistor 63, while Ena-BAR 64 is applied to the gate of shunt N-channel MOS transistor 66. Output is available at the collector of NPN transistor 61.

Figure 7:
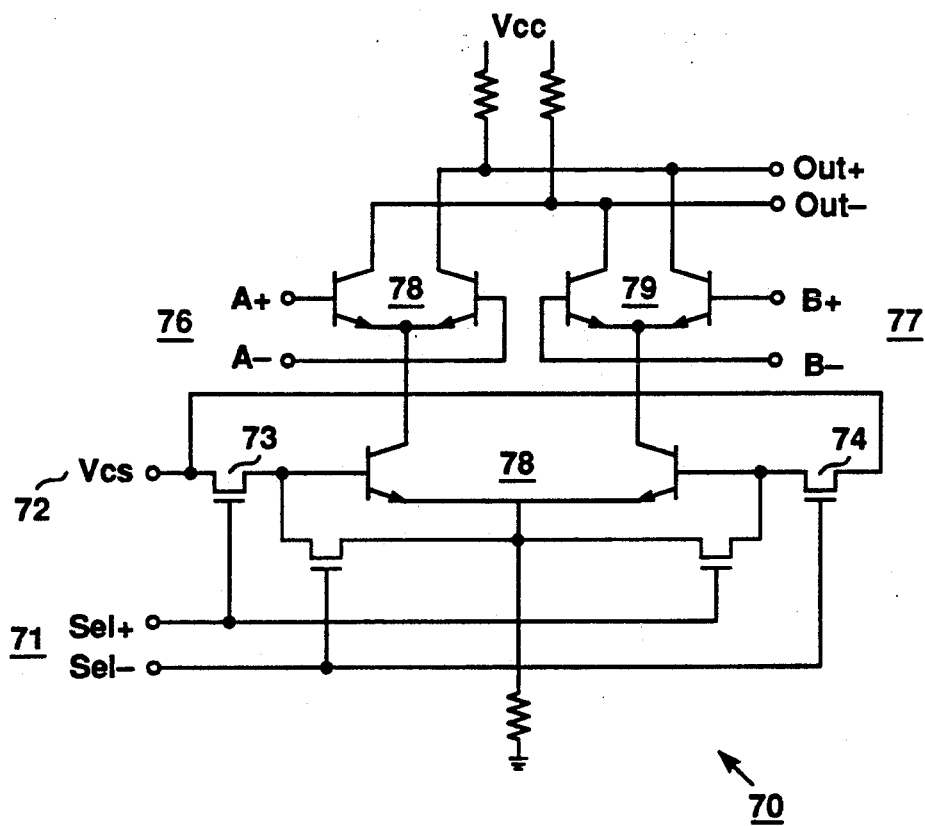
FIG. 7 illustrates an ECL multiplexer according to the present invention.

Reference is now made to FIG. 7, where another embodiment of the CML circuit according to the present invention is shown. FIG. 7 shows an improved CML multiplexer 70 with a built-in CMOS transistor as the select control input. In this circuit there is no need for an additional translator to convert CMOS levels to CML, since the SEL± inputs 71 are directly compatible with CMOS voltage swings. While the select path is not typically the one of the most speed critical paths in a circuit, the configuration shown above offers improved performance over the more typical connection discussed earlier.

Referring to FIG. 7, the improved multiplexer ("mux") 70 consists of the top portion of a typical CML mux that is connected to a pair of VCS current sources 72 that are alternatively selected by the N-channel MOS transistors 73, 74 connected between the Vcs reference source 72 and the base of the NPN transistors 75. Input 76, 77 voltage levels are compatible with normal CMOS logic levels and the delays are adequate for normal logic functions.

This connection keeps the high speed logic path in CML to maintain the logic swings and the drive capability of the CML logic form, and uses the CMOS inputs 71 to select which of diff pair 78 and 79 is active.

This circuit shown in FIG. 7 provides a convenient and efficient method to connect CMOS with ECL or CML logic functions. The suggested circuit would not require any additional reference generator circuitry or additional power to perform its function.

The same basic connection could be used for other logic functions than those shown above. It would be apparent to those skilled in the art to insert this CMOS translator and selector below almost any CML logic function. In addition to the differential select shown in FIG. 7, it is possible to select multiple logic functions by extending the number of current sources selected by the CMOS inputs as will be appreciated by those skilled in the art.

What is claimed is:

1. An ECL circuit with power control, said ECL circuit comprising:
    a pair of emitter-coupled transistors of a first conductive type, said pair coupled to an input and an inverted input at the bases of said pair, the collectors of said pair being coupled to a first voltage;
    current source transistor having its collector coupled to the coupled-emitters of said pair and its emitter coupled to a second voltage;
    first MOS transistor having a source/drain current path coupled in series with the base of said current source transistor, one end of said source/drain current path of said first MOS transistor being coupled to the base of said current source transistor and the other end of said source/drain current path of said first MOS transistor being coupled to a current source voltage, the gate of said first MOS transistor receiving an enable signal to control the state of said first MOS transistor,
wherein an activated first MOS transistor switches on said ECL circuit, and a de-activated first MOS transistor switches off said ECL circuit with no current through said current source transistor to provide a true power down of said ECL circuit.

2. An ECL circuit according to claim 1, wherein the switching speeds of said ECL circuit is critical, further comprising shunting means coupled across the base and emitter of said current source transistor.

3. An ECL circuit according to claim 2, wherein said shunting means comprises:
    second MOS transistor having a source/drain current path coupled across the base and emitter of said current source transistor at two ends of said source/drain current path of said second MOS transistor, the gate of said second MOS transistor receiving an inverted enable signal to control the state said second MOS transistor,
wherein an activated first MOS transistor and a de-activated second MOS transistor switch on said ECL circuit, and a de-activated first MOS transistor and an activated second MOS transistor switch off said ECL circuit with no current through said current source transistor.

4. An ECL circuit according to claim 1, wherein transistors in said first conductive type are n-p-n transistors.

5. An ECL circuit with power control according to claim 3, wherein transistors in said first conductive type are n-p-n transistors.

6. An ECL circuit with power control according to claim 5, further comprising:
    first output transistor of said first conductive type having its base coupled to a first collector of said pair and its collector coupled to the first voltage, the emitter of said first output transistor generating an output signal;
    second output transistor of said first conductive type having its base coupled to a second collector of said pair and its collector coupled to the first voltage, the emitter of said second output transistor generating an inverted output signal.

7. An ECL circuit with power control according to claim 6, further comprising a CMOS inverter for generating said inverted enable signal from said enable signal.

8. An ECL circuit for translating from CMOS to ECL levels, said ECL circuit comprising:
    a pair of emitter-coupled transistors of a first conductive type having their collectors coupled to a first voltage and their emitters coupled to ground;
    first MOS transistor having a source/drain current path coupled in series with a first base of said pair at one end of said source/drain current path of said first MOS transistor, the other end of said source/drain current path of said first MOS transistor being coupled to a current-source voltage, its gate receiving an enable signal;
    second MOS transistor having a source/drain current path coupled in series with a second base of said pair at one end of said source/drain current path of said second MOS transistor, the other end of said source/drain current path of said second MOS transistor being coupled to said current-source voltage, its gate being coupled to an inverted enable signal, wherein said pair has its two emitter-coupled transistors alternately switched on by said enable and said inverted enable signals.

9. An ECL circuit according to claim 8, further comprising:
    first shunting means coupled across said first base and said coupled-emitters of said pair; and
    second shunting means coupled across said second base and said coupled-emitters of said pair.

10. An ECL circuit according to claim 9, wherein:
    said first shunting means comprises third MOS transistor coupled across said first base and said coupled emitters of said pair, the gate of said third MOS transistor being coupled to said inverted enable signal, and
    said second shunting means comprises fourth MOS transistor coupled across said second base and said coupled emitters of said pair, its gate being coupled to said enable signal.

11. An ECL circuit according to claim 9, wherein:
    said first shunting means is a relatively high value resistor, and said second shunting means is a high value resistor for not critical turn-on and turn-off speed of said ECL circuit.

12. An ECL circuit according to claim 9, further comprising a CMOS inverter for generating said inverted enable signal from said enable signal such that a logic cell containing said ECL circuit is single-ended.

13. An ECL circuit according to claim 12, wherein said first conductive type is n-p-n type.

14. An ECL circuit according to claim 11, further comprising a CMOS inverter for generating said inverted enable signal from said enable signal such that a logic cell containing said ECL circuit is single-ended.

15. An ECL circuit according to claim 14, wherein said first conductive type is n-p-n type.

16. A single-ended ECL circuit for translating from CMOS to ECL levels, comprising:
   first transistor of a first conductive type, the collector of said first transistor coupled to a first voltage and the emitter of said first transistor coupled to a second voltage;
   first MOS transistor coupled in series between the base of said first transistor and a current-source voltage, the gate of said first MOS transistor receiving an enable signal to control the state of said first MOS transistor such that currents through said first transistor are shut off when said first MOS transistor is switched off,
   wherein an inverted output of said single-ended ECL circuit is generated at the collector of said first transistor.

17. A single-ended ECL circuit according to claim 16, further comprising second MOS transistor coupled across the base and emitter of said first transistor for shunting, the gate of said second MOS transistor receiving an inverted enable signal to control the state of said second MOS transistor.

18. A single-ended ECL circuit according to claim 17, wherein said first conductive type is n-p-n type.

19. A CML circuit for multiplexing CML inputs with CMOS select signals, said CML circuit comprising:
   first pair of emitter-coupled transistors of a first conductive type with their collectors coupled to a first voltage, the bases of said first pair receiving a first and inverted first inputs;
   second pair of emitter-coupled transistors of said first conductive type with their collectors coupled to said first voltage, the bases of said second pair receiving a second and inverted second inputs;
   third pair of emitter-coupled transistors of said first conductive type with the collector of a first transistor of said third pair coupled to the emitters of said first pair and the collector of a second transistor of said third pair coupled to the emitters of said second pair, the emitters of said third pair being coupled to a second voltage;
   first MOS transistor coupled in series between the base of said first transistor of said third pair and a current-source voltage, the gate of said MOS transistor receiving a select signal to control the state of said first MOS transistor;
   second MOS transistor coupled in series between the base of said second transistor of said third pair and said current-source voltage, the gate of said second MOS transistor receiving an inverted select signal to control the state of said second MOS transistor;
   wherein said first and second MOS transistors are alternately turned on by said select signal to switch on one of said first and second pair of emitter-coupled transistors to generate an output and an inverted output at the collectors of one of said first and second pair.

20. A CML circuit according to claim 19, further comprising shunting means, said shunting means comprising:
   third MOS transistor coupled across the base of said first transistor and the emitters of said third pair, the gate of said third MOS transistor receiving said inverted select signal;
   fourth MOS transistor coupled across the base of said second transistor and the emitters of said third pair, the gate of said fourth MOS transistor receiving said select signal,
   wherein said select signal switches on one of said first and second pairs of emitter-coupled transistors to generate an output and an inverted output at the collectors of one of said first and second pair by turning on one of said first and said second MOS transistors.

21. A CML circuit according to claim 20, wherein said first conductive type is n-p-n conduction.

* * * * *